US012309971B2

(12) United States Patent
Liu et al.

(10) Patent No.: US 12,309,971 B2
(45) Date of Patent: May 20, 2025

(54) DUAL-STACKED MOTHERBOARDS FOR FLUID IMMERSION COOLING

(71) Applicant: SUPER MICRO COMPUTER, INC., San Jose, CA (US)

(72) Inventors: Yueh Ming Liu, Taipei (TW); Yu Hsiang Huang, Taipei (TW); Yu Chuan Chang, Taipei (TW); Hsiao Chung Chen, Taipei (TW); Tan Hsin Chang, Taipei (TW)

(73) Assignee: Super Micro Computer, Inc., San Jose, CA (US)

( * ) Notice: Subject to any disclaimer, the term of this patent is extended or adjusted under 35 U.S.C. 154(b) by 596 days.

(21) Appl. No.: 17/579,958

(22) Filed: Jan. 20, 2022

(65) Prior Publication Data
US 2023/0232582 A1 Jul. 20, 2023

(51) Int. Cl.
H05K 7/20 (2006.01)

(52) U.S. Cl.
CPC ......... H05K 7/203 (2013.01); H05K 7/20809 (2013.01)

(58) Field of Classification Search
CPC ............... H05K 7/20236; H05K 7/203; H05K 7/20809; H05K 1/144; G06F 1/184–185; G06F 1/187
See application file for complete search history.

(56) References Cited

U.S. PATENT DOCUMENTS

| | | | | |
|---|---|---|---|---|
| 7,042,734 B2* | 5/2006 | Hensley | .................. | G06F 1/184 |
| | | | | 361/742 |
| 7,280,373 B2* | 10/2007 | Aizawa | .................... | G06F 1/184 |
| | | | | 361/802 |
| 7,619,900 B2* | 11/2009 | McClure | .............. | H05K 7/1487 |
| | | | | 361/752 |
| 8,289,692 B2* | 10/2012 | Franz | ...................... | G06F 1/183 |
| | | | | 361/679.33 |
| 8,537,563 B2* | 9/2013 | Purcell | ................... | H05K 1/148 |
| | | | | 361/801 |

(Continued)

FOREIGN PATENT DOCUMENTS

| | | | | | |
|---|---|---|---|---|---|
| CN | | 110958819 A | * | 4/2020 | ......... H05K 7/20236 |
| CN | | 111198601 A | * | 5/2020 | ............. G06F 1/183 |
| WO | WO-2023223242 A1 | * | 11/2023 | ......... H05K 7/20818 |

OTHER PUBLICATIONS

Issam Mudawar, et al. "Immersion-Cooled Standard Electronic Clamshell Module: A Building Block for Future High-Flux Avionic Systems", Jun. 1994, p. 116-125, vol. 116.Journal of Electronic Packaging.

*Primary Examiner* — Robert J Hoffberg
(74) *Attorney, Agent, or Firm* — Beyer Law Group LLP

(57) ABSTRACT

A server computer system has one or more node assemblies. A node assembly has two motherboards that are stacked one over another with their component sides facing toward each other. Memory cards that are mounted on one motherboard are interlaced with memory cards that are mounted on the other motherboard. At least processors of the two motherboards are immersed in a coolant fluid in a fluid immersion cooling tank. A processor cooling stack is mounted over a processor. The processor cooling stack includes flow regulation structures with sidewalls that regulate flow of vapor bubbles of the coolant fluid away from the processor.

11 Claims, 15 Drawing Sheets

(56) References Cited

U.S. PATENT DOCUMENTS

| | | | | |
|---|---|---|---|---|
| 8,908,369 B2* | 12/2014 | Lin | | G06F 1/183 |
| | | | | 361/679.48 |
| 8,958,206 B2* | 2/2015 | French, Jr. | | G06F 1/181 |
| | | | | 361/679.58 |
| 8,976,536 B2* | 3/2015 | French, Jr. | | H05K 7/1427 |
| | | | | 361/755 |
| 8,995,143 B2* | 3/2015 | Lin | | G06F 1/185 |
| | | | | 361/755 |
| 9,049,800 B2 | 6/2015 | Shelnutt et al. | | |
| 9,110,640 B2* | 8/2015 | Lin | | G06F 1/185 |
| 9,223,358 B2* | 12/2015 | Lin | | G06F 1/185 |
| 9,250,648 B2* | 2/2016 | Shih | | G06F 1/185 |
| 9,560,789 B2* | 1/2017 | Smith | | G06F 1/20 |
| 10,123,446 B1* | 11/2018 | Hou | | H05K 5/0021 |
| 10,398,063 B2* | 8/2019 | Smith | | H01L 23/473 |
| 10,499,488 B1* | 12/2019 | Tsai | | H05K 1/144 |
| 10,750,639 B2* | 8/2020 | Lunsman | | H05K 7/20336 |
| 10,806,056 B2* | 10/2020 | Cuda | | H05K 7/20763 |
| 10,888,031 B2* | 1/2021 | Franz | | G11C 29/56016 |
| 11,191,186 B2* | 11/2021 | Smith | | H05K 7/203 |
| 11,744,041 B2* | 8/2023 | Smith | | H05K 7/20327 |
| | | | | 361/699 |
| 11,965,846 B2* | 4/2024 | Fitch | | H05K 7/20818 |
| 11,974,414 B2* | 4/2024 | Ferrer Medina | | H05K 7/20509 |
| 2009/0086422 A1* | 4/2009 | McClure | | H05K 7/20727 |
| | | | | 361/679.48 |
| 2014/0133085 A1* | 5/2014 | Lin | | G06F 1/185 |
| | | | | 361/679.32 |
| 2015/0022975 A1* | 1/2015 | Browne | | H05K 7/14337 |
| | | | | 361/700 |
| 2017/0172011 A1* | 6/2017 | Chen | | H05K 7/20636 |
| 2019/0294220 A1* | 9/2019 | Saito | | G06F 1/20 |
| 2020/0236808 A1* | 7/2020 | Smith | | H05K 7/20818 |
| 2022/0117114 A1* | 4/2022 | Farias Moguel | | H05K 7/20272 |
| 2022/0201889 A1* | 6/2022 | Sover | | H01L 23/44 |
| 2023/0125822 A1* | 4/2023 | Adebiyi | | H01L 23/3737 |
| | | | | 361/699 |
| 2023/0137684 A1* | 5/2023 | Yang | | H01L 23/3736 |
| | | | | 257/715 |
| 2023/0180434 A1* | 6/2023 | Shia | | H05K 7/20381 |
| | | | | 361/700 |
| 2024/0015928 A1* | 1/2024 | Jian | | H05K 7/20236 |
| 2024/0224476 A1* | 7/2024 | Kajitani | | G06F 1/20 |

* cited by examiner

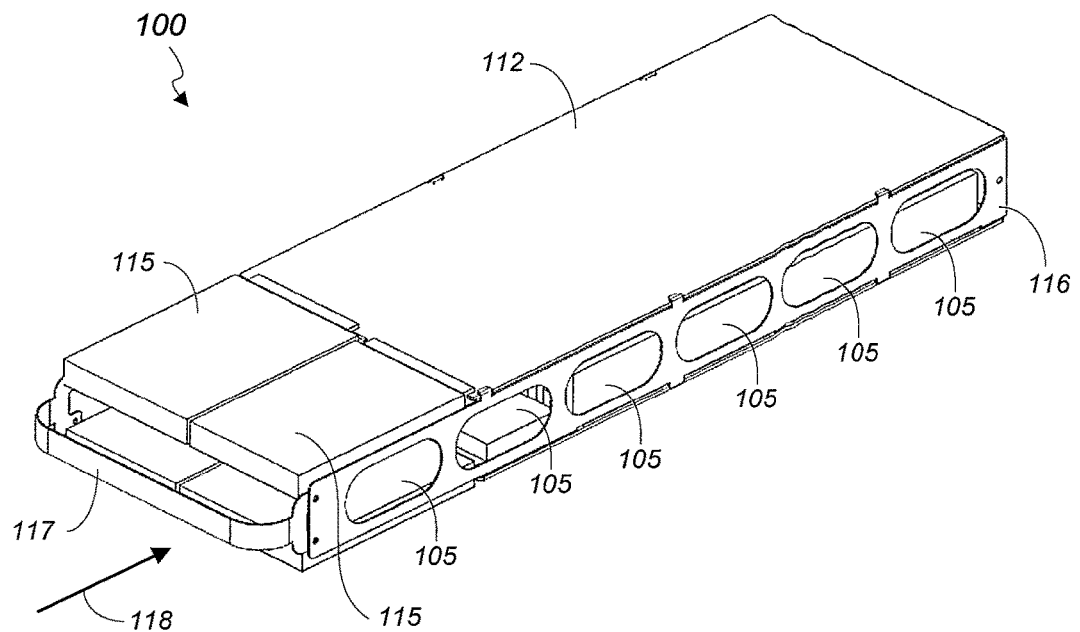
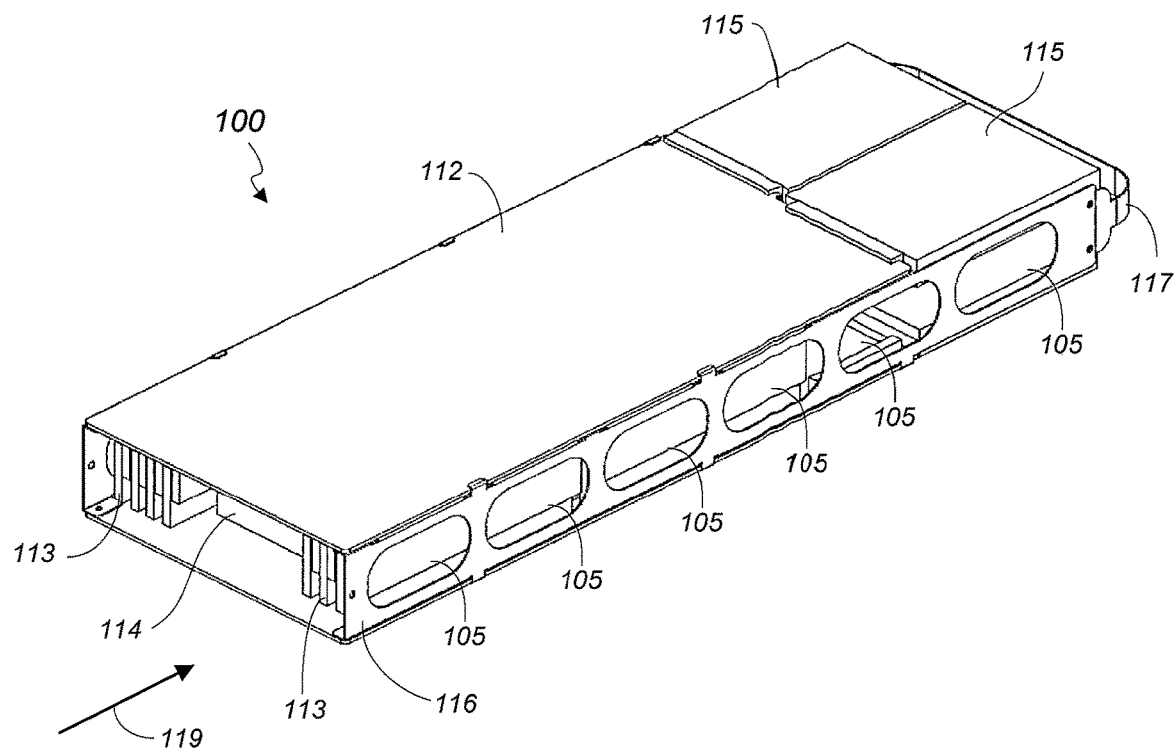
FIG. 3

US 12,309,971 B2

DUAL-STACKED MOTHERBOARDS FOR FLUID IMMERSION COOLING

TECHNICAL FIELD

The present invention is directed to computer systems.

BACKGROUND

Server computer systems are configured to process requests and deliver data to other computers over a computer network. Unlike a personal computer, such as a desktop or laptop computer, a server computer system typically has a plurality of processors. The processors are available as modules of the server computer system, with each module also referred to as a "node." A node comprises memory, one or more processors, and/or other components mounted on a motherboard. In a large data center, cooling of the nodes is critical because the processors and other electronic components on the motherboard generate a lot of heat.

A server computer system may be cooled by fluid immersion cooling, wherein processors and other high-heat generating components are immersed in a coolant fluid. In a conventional dual-phase fluid immersion cooling system, heat generated by electronic components turns a dual-phase coolant fluid into vapor bubbles, which rise to be collected by a condenser unit. The condenser unit is a piece of equipment that turns the vapor bubbles to liquid, which rejoins the dual-phase coolant fluid to complete the cooling cycle.

BRIEF SUMMARY

In one embodiment, a computer system includes a node assembly comprising a first motherboard and a second motherboard that each has a processor and memory cards mounted thereon. The memory cards mounted on the first motherboard are interlaced with the memory cards mounted on the second motherboard. The computer system further includes a fluid immersion cooling tank, wherein at least the processors mounted on the first and second motherboards are immersed in a coolant fluid in the fluid immersion cooling tank.

In another embodiment, a node assembly of a server computer system includes a first motherboard and a second motherboard. The first motherboard is stacked over the second motherboard with the component side of the first motherboard facing toward the component side of the second motherboard and memory cards mounted on the first motherboard are interlaced with memory cards mounted on the second motherboard. At least the processors of the first and second motherboards are immersed in a coolant fluid in a fluid immersion cooling tank.

In yet another embodiment, a computer includes a motherboard having a component side and a bottom side. A processor socket is mounted on the component side. An integrated circuit (IC) processor is mounted on the processor socket on the component side. A plate is attached to a surface of the IC processor. A flow regulation structure is disposed between a flow control cover and the plate. The IC processor is configured to be immersed in a coolant fluid in a fluid immersion cooling tank. The flow regulation structure regulates flow of vapor bubbles of the coolant fluid away from the IC processor.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 3 shows perspective views of an assembled node assembly in accordance with an embodiment of the present invention.

DETAILED DESCRIPTION

In the present disclosure, numerous specific details are provided, such as examples of systems, components, structures, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
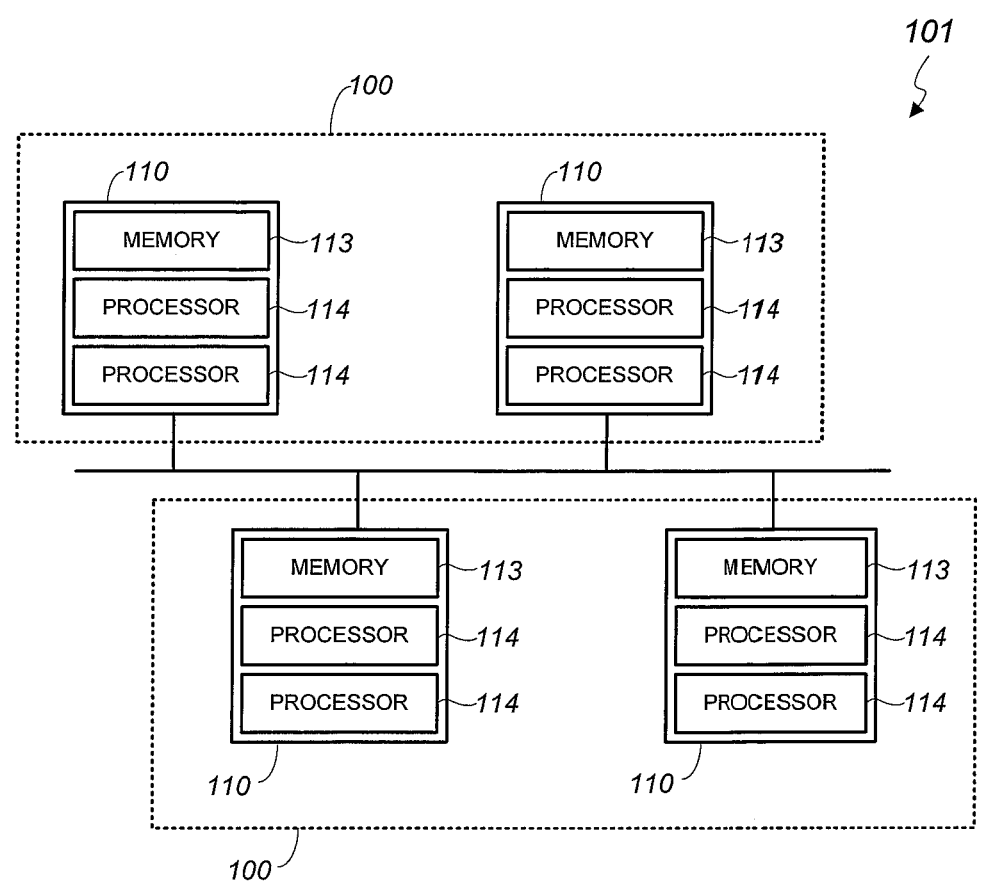
FIG. 1 shows a schematic diagram of a server computer system in accordance with an embodiment of the present invention.

FIG. 1 shows a schematic diagram of a server computer system 101 in accordance with an embodiment of the present invention. The computer system 101 comprises a plurality of nodes 110, with each node 110 functioning as a computer with its own memory cards 113 and one or more processors 114. The nodes 110 may communicate over one or more buses, computer network, or other computer communication means. In one embodiment, two nodes 110 are mechanically packaged together to form a node assembly 100. The server computer system 101 may have one or more node assemblies 100 depending on its node requirements.

Figure 2:
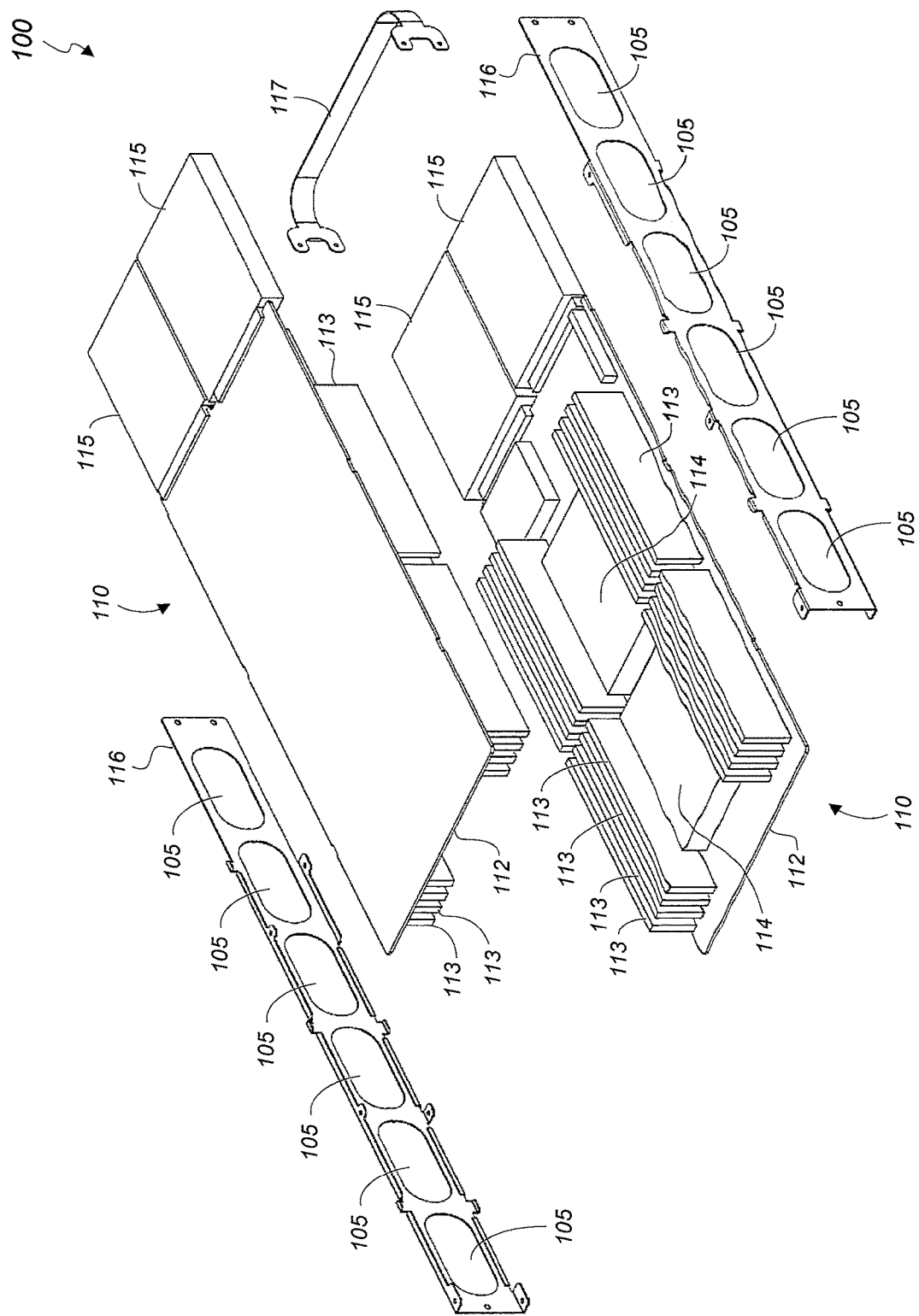
FIG. 2 shows an exploded view of a node assembly in accordance with an embodiment of the present invention.

FIG. 2 shows an exploded view of a node assembly 100 in accordance with an embodiment of the present invention. In the example of FIG. 2, the node assembly 100 has two nodes 110. Each node 110 comprises a motherboard 112, two processors 114, and sixteen memory cards 113. The motherboard 112 provides a substrate on which the processors 114 and memory cards 113 are mounted. The number of processors 114, memory cards 113, and other components of the node 110 may vary depending on the particulars of the server computer system 101. Only some of the memory cards 113 are labeled to minimize clutter on the figures.

A motherboard 112 has a topside (also referred to as "component side") on which the processors 114 and memory cards 113 are mounted and a bottom side that is opposite the topside. The two motherboards 112 of the node assembly 100 are dual-stacked with their topsides facing each other. The motherboards 112 may have an identical design and component layout. This advantageously simplifies production and inventory management of the motherboards 112.

Figure 7:
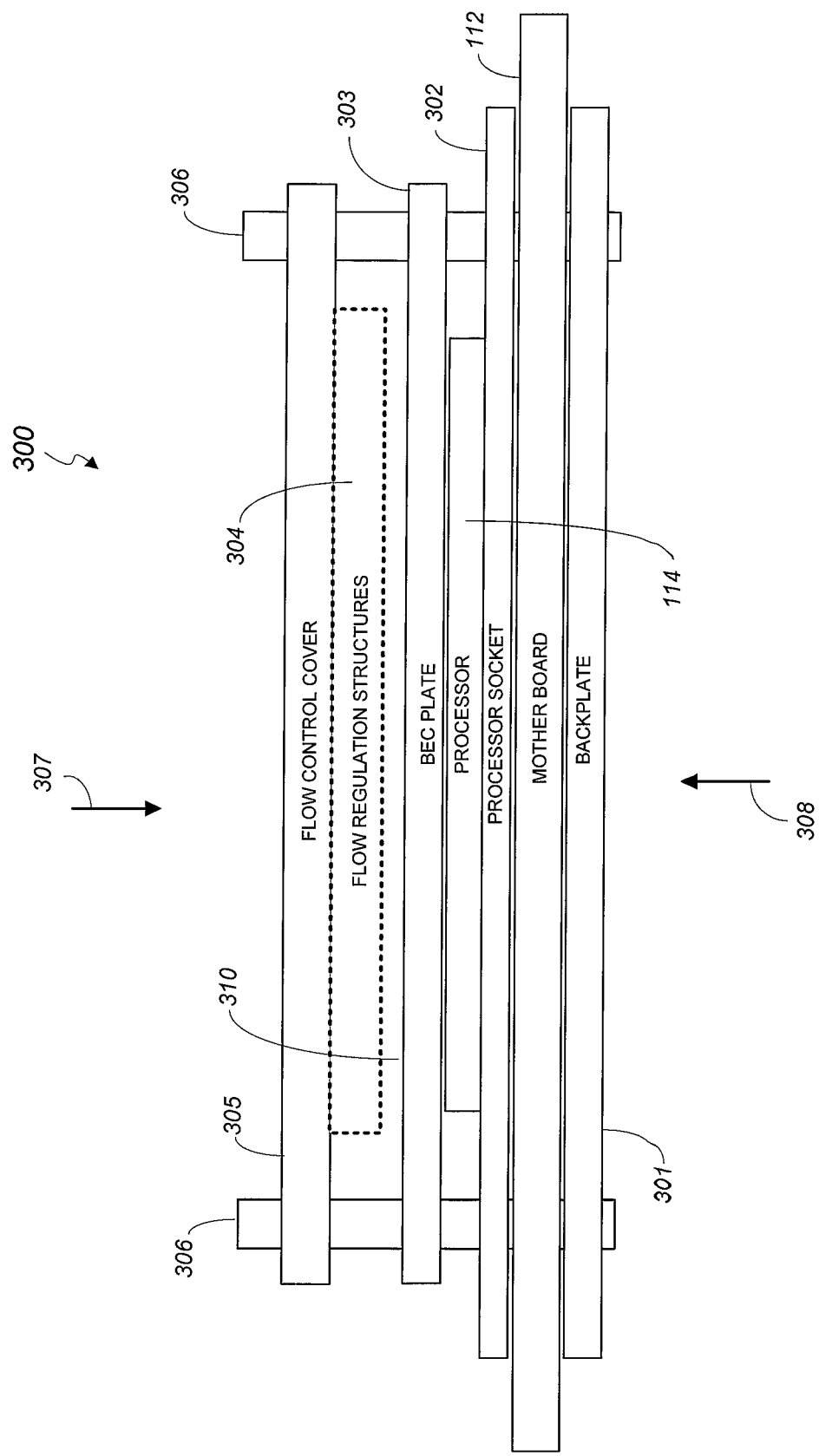
FIG. 7 shows a schematic diagram of a processor cooling stack in accordance with an embodiment of the present invention.

For each node 110, a processor 114 is removably mounted on a topside of a motherboard 112, for example by way of a socket (e.g., see FIG. 7, socket 302). A processor 114 may be an Intel™, Advanced Micro Devices™, or other integrated circuit (IC) processor. The memory cards 113 are also removably mounted on the topside of the motherboard 112, for example by way of a connector (not shown). Each memory card 113 may be a Dual In-line Memory Module (DIMM) that contains a plurality of random-access memory (RAM) IC chips. The memory cards 113, which protrude perpendicularly relative to the plane of the motherboard 112, are the tallest cards on the motherboard 112. The memory cards 113 flank a corresponding processor 114. The processors 114 are disposed in-line on the motherboard 112. The node 110 may include other components that are generally labeled as "115." The components 115, which may be attached to the motherboard 112, may include Ethernet ports, light emitting diodes, serial ports, and/or other components of a typical computer.

The memory cards 113 of a motherboard 112 are spaced apart so that they can be interlaced with memory cards 113 of the other motherboard 112 when the two motherboards 112 are stacked with their topsides facing each other. Stacking the two motherboards 112 with their memory cards 113 interlaced advantageously increases the node density of the server computer system 101. A pair of frames 116 provides a support structure that holds the two nodes 110 together to form the node assembly 100. Each of the frames 116 has a plurality of openings 105 for improved coolant fluid flow and heat exchange when the node assembly 100 is immersed in a fluid immersion cooling tank (e.g., see FIG. 5, cooling tank 200). The motherboards 112 may be fastened (e.g., using screws, bolts, etc.) to the frames 116 to form a cuboid with an open bottom end and an open top end. The bottom and top ends of the node assembly 100 are along the width of the motherboard 112, whereas the frames 116 are along the length of the motherboard 112. A handle 117 is mounted (e.g., on the frames 116) on the top end of the node assembly 100 to facilitate moving the node assembly 100 into and out of the cooling tank.

FIG. 3 shows perspective views of an assembled node assembly 100 in accordance with an embodiment of the present invention. FIG. 3 shows the open top end (see arrow 118; handle 117) and the open bottom end (see arrow 119) of the node assembly 100. The motherboards 112 form opposite side planes of the cuboid, whereas the frames 116 form opposite side planes of the cuboid that are perpendicular to the planes of the motherboards 112. The open top end and bottom end of the node assembly 100 facilitate flow of the coolant fluid through the node assembly 100. The motherboards 112 block coolant fluid flow toward the plane of the motherboards 112. When the node assembly 100 is immersed in the cooling tank, coolant fluid may flow through the open bottom end (see arrow 119) and side-to-side through the openings 105 on the frames 116.

Figure 4:
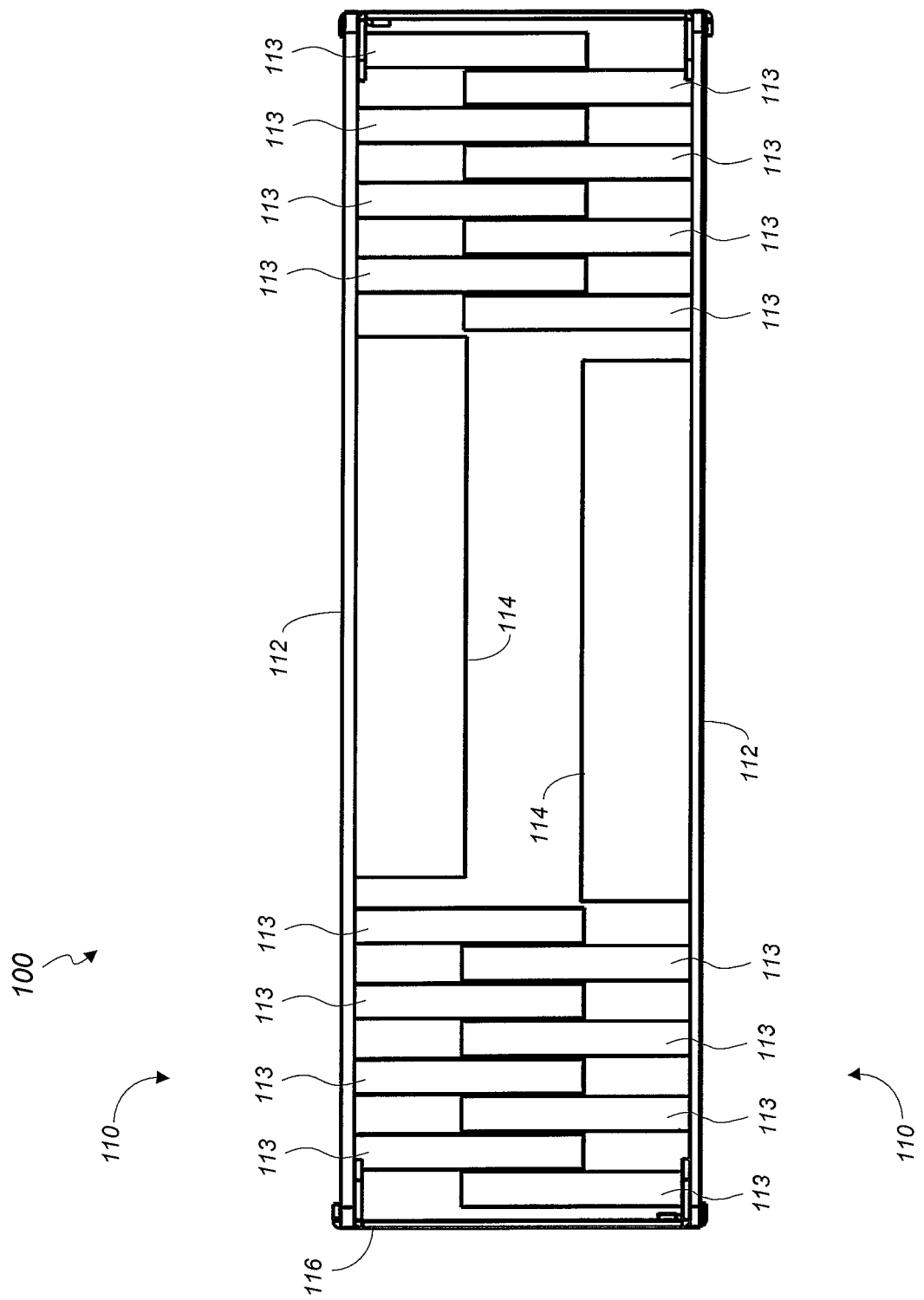
FIG. 4 shows a bottom-end view of a node assembly in accordance with an embodiment of the present invention.

FIG. 4 shows a bottom-end view of the node assembly 100 in accordance with an embodiment of the present invention. In the example of FIG. 4, the motherboard 112 of a node 110 is stacked on the motherboard 112 of the other node 110 to form dual-stacked motherboards 112. The topsides ("component side") of the motherboards 112 face toward each other. The memory cards 113 of the nodes 110 are interlaced. That is, a memory card 113 of one node 110 is between adjacent memory cards of the other node 110 in alternating fashion as shown in FIG. 4. The memory cards 113 are the tallest boards on a motherboard 112. Generally, on dual-stacked motherboards 112, the tallest boards on a motherboard 112 are interlaced with the same boards on the other motherboard 112.

Figure 5:
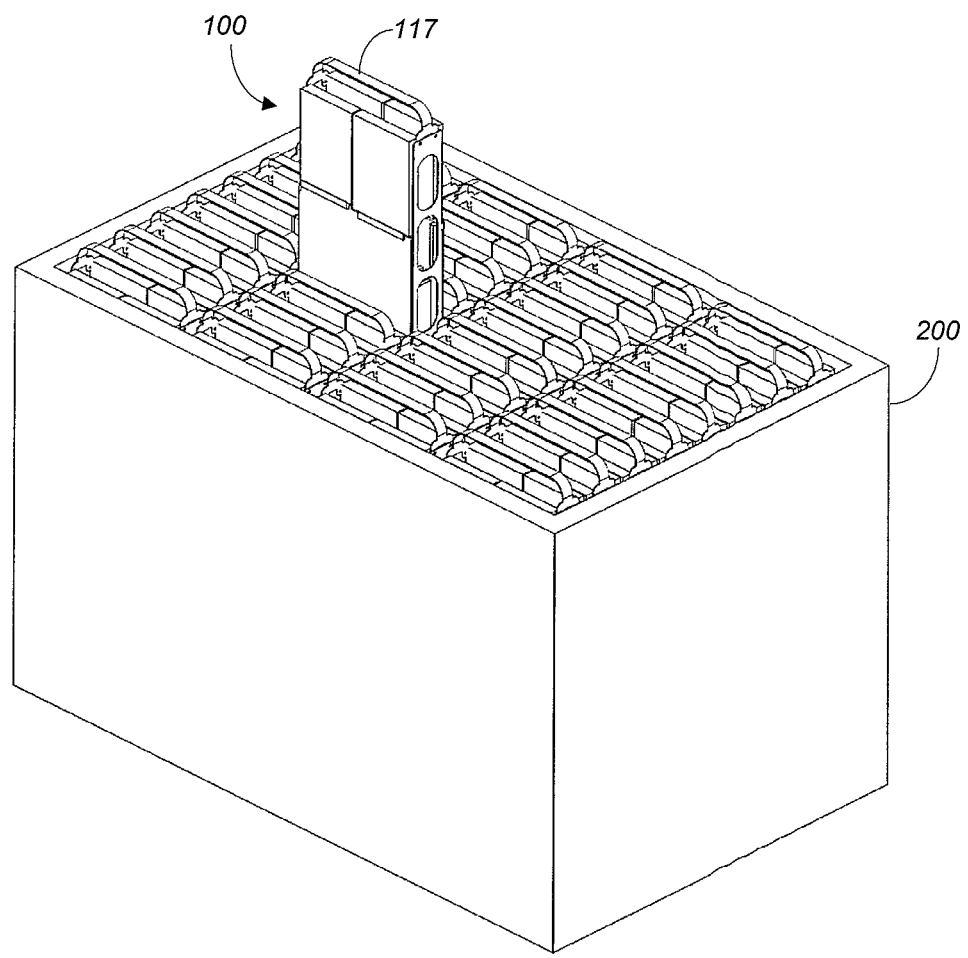
FIG. 5 shows a perspective view of a fluid immersion cooling tank with node assemblies in accordance with an embodiment of the present invention.

FIG. 5 shows a perspective view of a fluid immersion cooling tank 200 with node assemblies 100 in accordance with an embodiment of the present invention. In the example of FIG. 5, each node assembly 100 has a so-called "4U" form factor. The cooling tank 200 accommodates 8 rows of node assemblies 100, with each row having 4 node assemblies 100 for a total of 32 node assemblies 100. Because each node assembly 100 has two nodes, the cooling tank 200 accommodates 64 nodes. The handle 117 facilitates placement of a node assembly 100 in and out of the cooling tank 200. The cooling tank 200 includes other well-known cooling tank components, such as wiring interfaces/ports, plumbing, manifold, heat exchanger, etc., which are not shown for clarity of illustration. The cooling tank 200 may be a conventional or commercially-available fluid immersion cooling tank.

Figure 6:
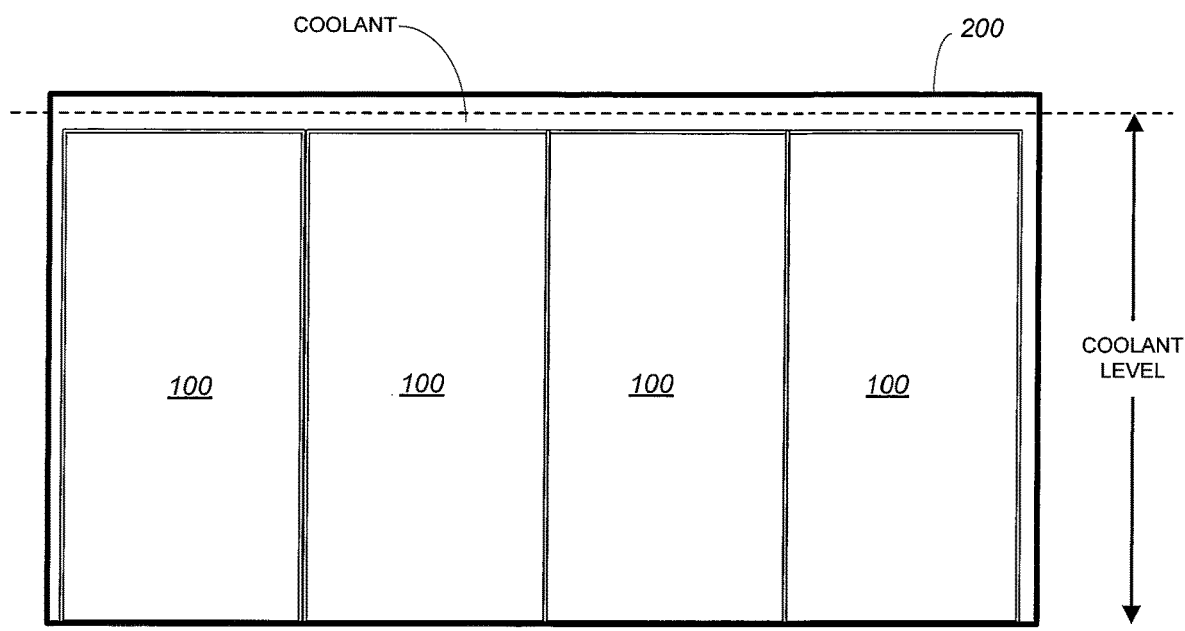
FIG. 6 shows a schematic diagram of the cooling tank with node assemblies of FIG. 5 in accordance with an embodiment of the present invention.

FIG. 6 shows a schematic diagram of the cooling tank 200 in accordance with an embodiment of the present invention. In the example of FIG. 6, the cooling tank 200 is filled with a dual-phase coolant fluid, such as the 3M™ FC-3284 Fluorinert™ Electronic Liquid, for example. The particulars of the coolant fluid may vary depending on the working temperature. The level of the coolant fluid is adjusted to immerse at least the high-heat generating components of the node assembly 100, such as the processors 114, in the coolant fluid. The principle of operation of dual-phase fluid immersion cooling is well known. Briefly, heat from components of the node assemblies 100 vaporizes the coolant fluid to generate vapor bubbles that rise to the top of the cooling tank 200. A condenser (not shown) or other condensing means turns the vapor bubbles back to liquid form.

Because of the dual-stacked arrangement with interlaced memory cards 113 of the motherboards 112, and the resulting high-density of nodes, the use of fluid immersion cooling is critical to prevent overheating. However, vapor bubbles that are generated when the coolant fluid absorbs heat may, in some configurations, decrease cooling efficiency especially around the processors 114. In some embodiments, the node assemblies 100 incorporate one or more flow regulation structures to control the flow of the vapor bubbles over the processors 114 as now described beginning with FIG. 7.

FIG. 7 shows a schematic diagram of a processor cooling stack 300 in accordance with an embodiment of the present invention. As its name indicates, the cooling stack 300 facilitates cooling of a processor 114 that is mounted on a motherboard 112. FIG. 7 is a side view, which truncates the motherboard 112 for clarity of illustration. The topsides of the components of the cooling stack 300 are as seen from an arrow 307, whereas the bottom sides of the components of the cooling stack 300 are as seen from an arrow 308.

In the example of FIG. 7, the processor 114 is removably mounted on the motherboard 112 by way of a processor socket 302, which is mounted on the topside of the motherboard 112. A backplate 301, which is is mounted on the bottom side of the motherboard 112, is a metal plate that functions as a mechanical structure to support at least the processor socket on the cooling stack 300. A plate 303 is a metal plate with Boiling Enhancement Coating (BEC). As can be appreciated, other suitable compound treatment to enhance or facilitate the boiling mechanism may also be used. The BEC plate 303 is attached to and directly contacts the topside surface of the processor 114 to facilitate cooling of the processor 114. The use of the BEC plate 303, instead of a traditional heatsink with protruding metal structures, allows for a low profile and provides sufficient space to allow the coolant fluid and vapor bubbles to flow in a gap (see FIG. 7, 310) between the flow regulation structures 304 and the BEC plate 303.

In the example of FIG. 7, the flow regulation structures 304 are on a bottom side of the flow control cover 305. The flow regulation structures 304 may be attached to or be formed integrally with the flow control cover 305. The flow regulation structures 304 and/or the flow control cover 305 may be made of a material that is compatible with fluid immersion cooling, e.g., metal, plastic, or other material that is compatible with the coolant fluid. The vertical distance between the flow regulation structures 304 and the topside surface of the BEC plate 303 may be adjusted to control the flow of vapor bubbles therebetween. The flow control cover 305 and the BEC plate 303 may be supported by standoffs 306 or other support structures that are mounted on the motherboard 112. The processor cooling stack 300 may include screws, nuts, bolts, and/or other fastening hardware (not shown).

Figure 8:
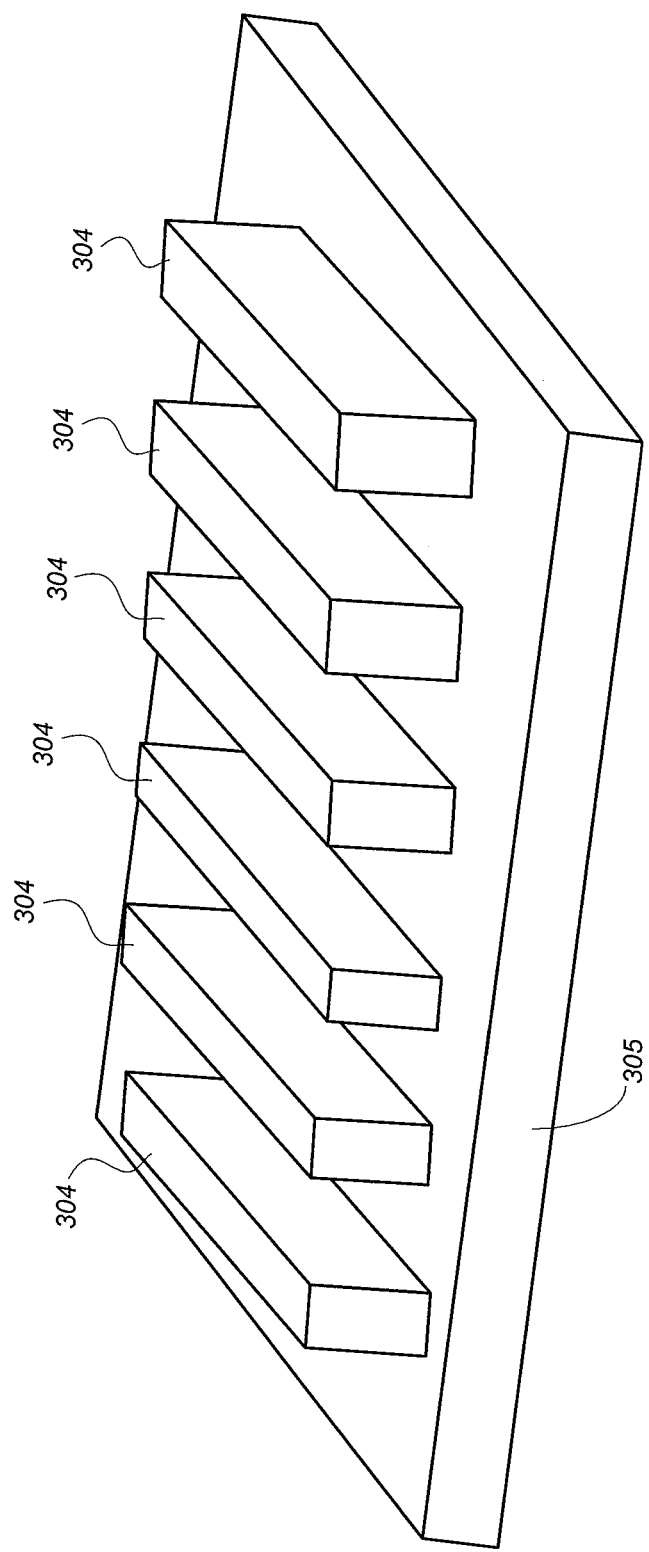
FIG. 8 shows a perspective view of flow regulation structures in accordance with an embodiment of the present invention.

FIG. 8 shows a perspective view of the flow regulation structures 304 in accordance with an embodiment of the present invention. In the example of FIG. 8, the flow control cover 305 is depicted bottom-side up to show the flow regulation structures 304. In one embodiment, the flow regulation structures 304 comprise a plurality of walls that function as fixed rudders that regulate the flow of vapor bubbles of the coolant fluid. The direction of the sidewalls of the flow regulation structures 304 may be adjusted to direct the flow of vapor bubbles away from the processors 114. The sidewalls of the flow regulation structures 304 may be formed perpendicular to the bottom side of the flow control cover 305.

Figure 9:
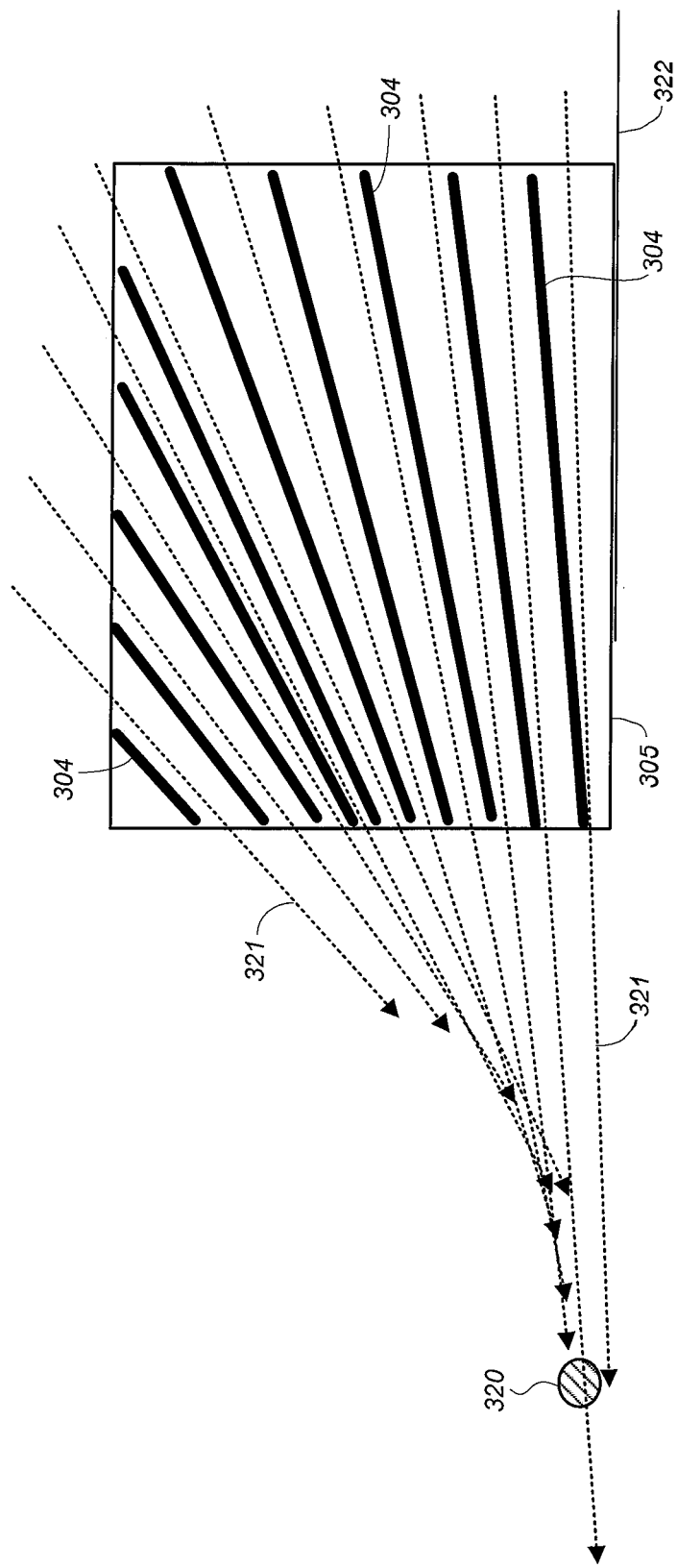
FIGS. 9-13 schematically show the flow of vapor bubbles of coolant fluid through flow regulation structures in accordance with an embodiment of the present invention.

FIG. 9 schematically shows the flow of vapor bubbles of the coolant fluid through the flow regulation structures 304 in accordance with an embodiment of the present invention. In FIGS. 9-13, dotted arrow lines (see FIG. 9, 321) represent vapor bubble flow as seen from the bottom of the flow control cover 305. Referring to FIG. 9, the flow regulation structures 304 are arranged so that their sidewalls form an angle that is less than 90 degrees relative to a common perimeter line (e.g., see FIG. 9, 322) of the flow control cover 305 so that the vapor bubbles flow toward a common focus region 320. In the example of FIG. 9, the sidewalls of the flow regulation structures 304 line up toward the focus region 320 to direct vapor bubbles flowing over the processor 114, between the flow regulation structures 304 and the BEC plate 303, to the focus region 320.

Figure 10:
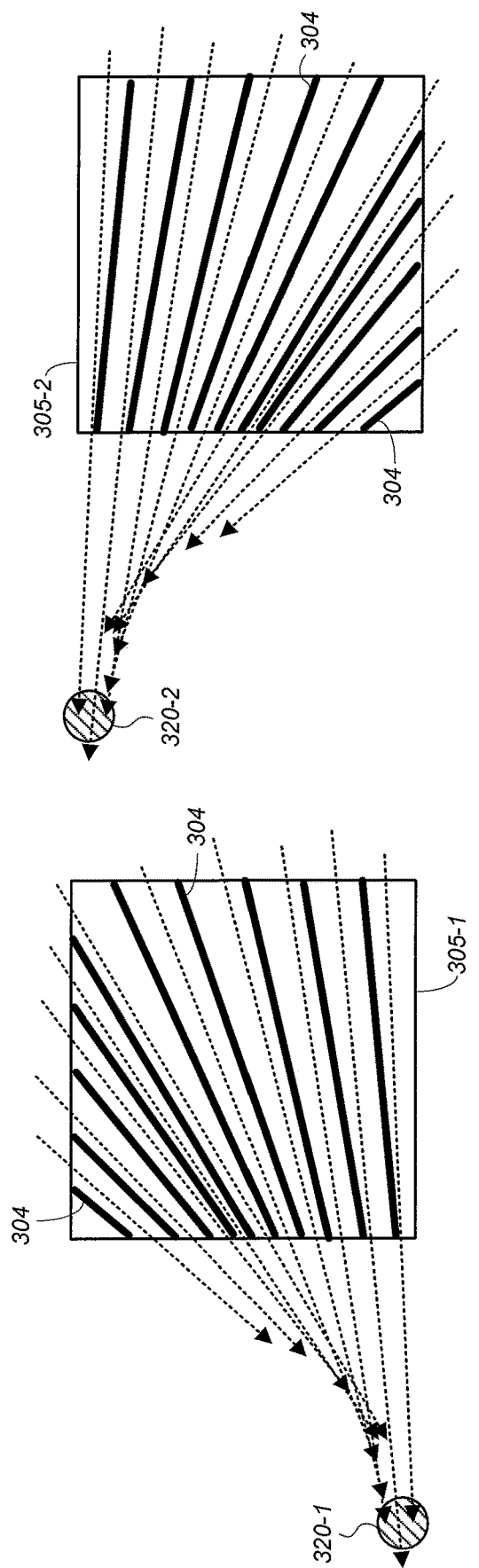

The location of the focus region 320 changes the direction of the flow of the vapor bubbles. The focus region 320 may be adjusted by making a corresponding change to the orientation of the sidewalls of the flow regulation structures 304. FIG. 10 schematically shows the bottom sides of flow control covers 305 (i.e., 305-1, 305-2) of adjacent processor cooling stacks 300 on a motherboard 112. In the example of FIG. 10, the sidewalls of the flow control structures 304 of the flow control cover 305-1 direct the vapor bubbles toward a focus region 320-1, whereas the sidewalls of the flow control structures 304 of the flow control cover 305-2 direct the vapor bubbles toward a focus region 320-2. By directing the vapor bubbles on opposite corners, the vapor bubbles flowing over the processor 114 corresponding to the flow control cover 305-2 will flow away from the processor 114 corresponding to the flow control cover 305-1. The flow regulation structures 304 advantageously minimize flow of vapor bubbles from the bottom end to the top end of the node assembly 100 over the processors 114.

Figure 11:
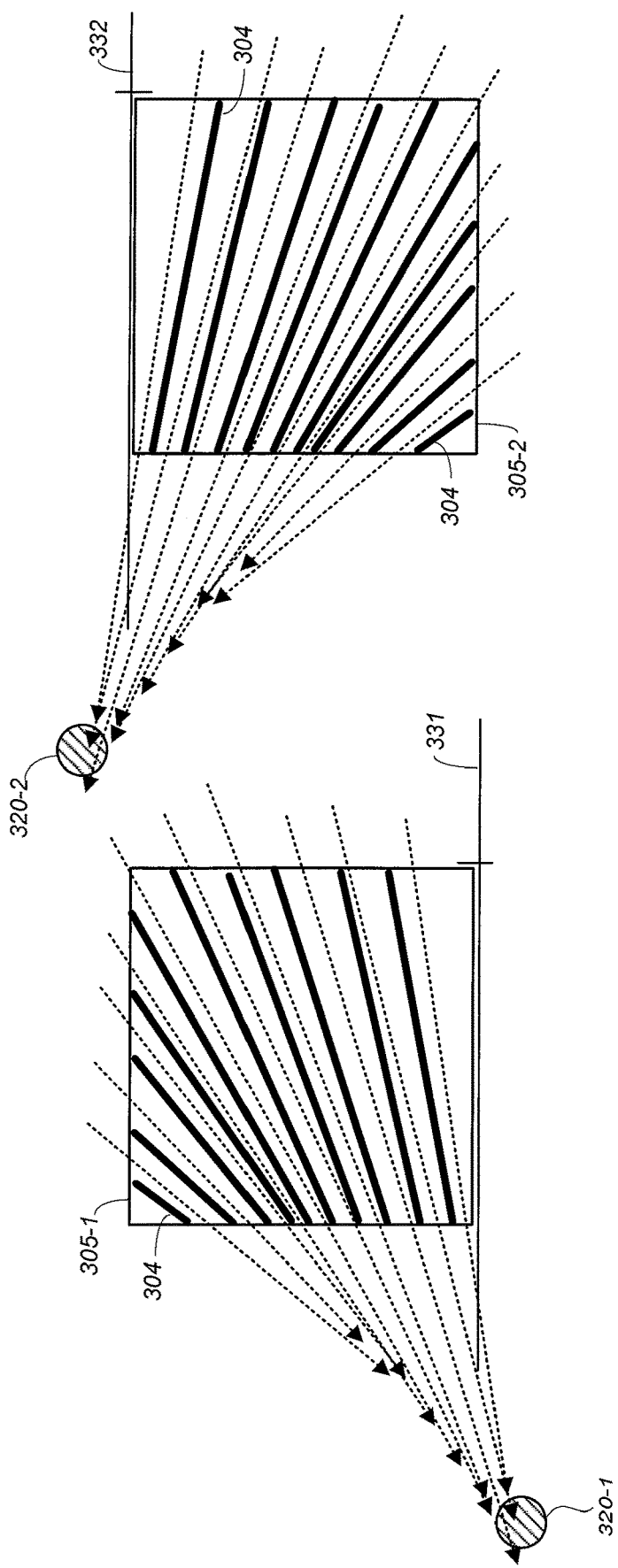

FIG. 11 schematically shows the bottom sides of flow control covers 305 (i.e., 305-1, 305-2) of adjacent processor cooling stacks 300 on a motherboard 112. FIG. 11 is the same as FIG. 10 except that the focus regions 320 (i.e., 320-1, 320-2) are located, by adjusting the orientation of the sidewalls of the flow regulation structures 304, outside a perimeter line of the corresponding flow control cover 305. More particularly, the focus region 320-1 is located on the side of the perimeter line 331 that is away from the flow control cover 305-1. This increases the angle of the sidewalls of the flow regulation structures 304 relative to the perimeter line 331, thereby further directing the vapor bubbles away from the processor 114 that corresponds to the flow control cover 305-1. Similarly, the focus region 320-2 is located on the side of the perimeter line 332 that is away from the flow control cover 305-2, thereby further directing the vapor bubbles away from the processor 114 that corresponds to the flow control cover 305-2.

Figure 12:
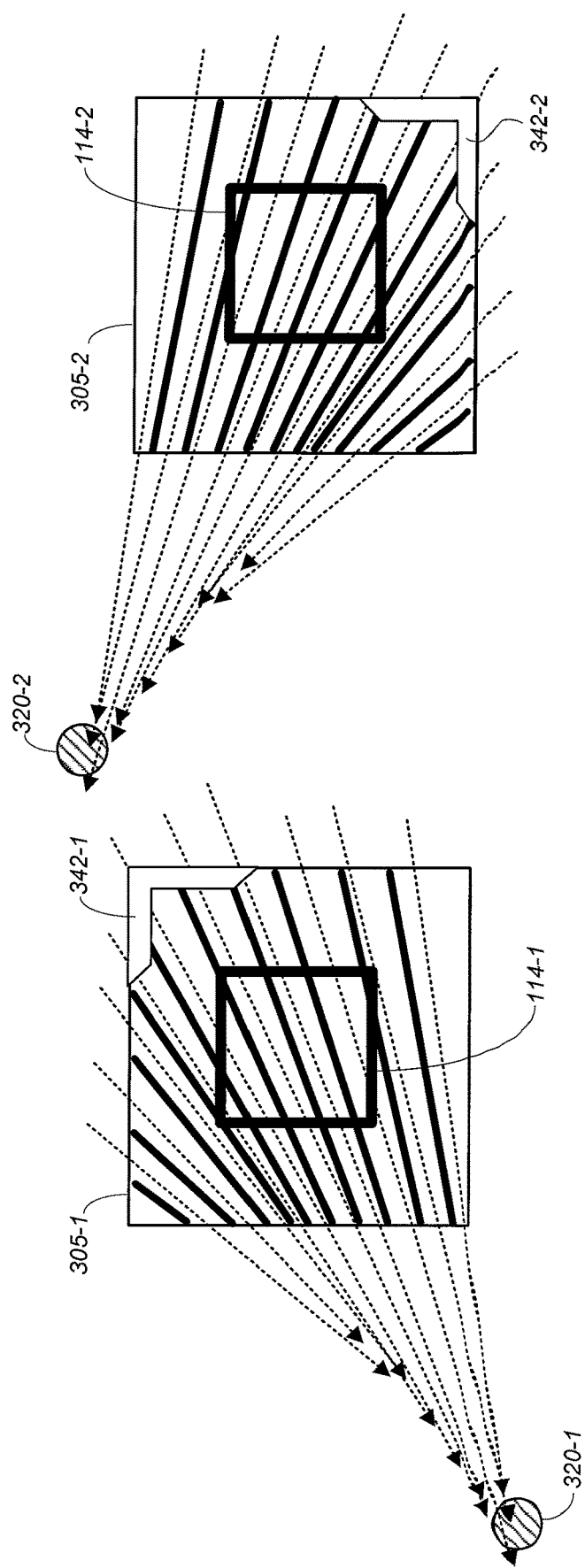

FIG. 12 schematically shows the bottom sides of flow control covers 305 (i.e., 305-1, 305-2) of adjacent processor cooling stacks 300 on a motherboard 112. FIG. 12 is the same as FIG. 11 except that an additional flow regulation structure 342 (i.e., 342-1, 342-2) is attached to or integrated with the flow control cover 305 to block off particular regions. In the example of FIG. 12, the flow regulation structure 342-1 has an L-shape with walls that block off vapor bubbles from a corner of the flow control cover 305-1. Similarly, the flow regulation structure 342-2 has an L-shape with walls that block off vapor bubbles from a corner of the flow control cover 305-2. FIG. 12 shows the general location of the processors 114 (i.e., 114-1, 114-2) relative to their respective covers 305.

Figure 13:
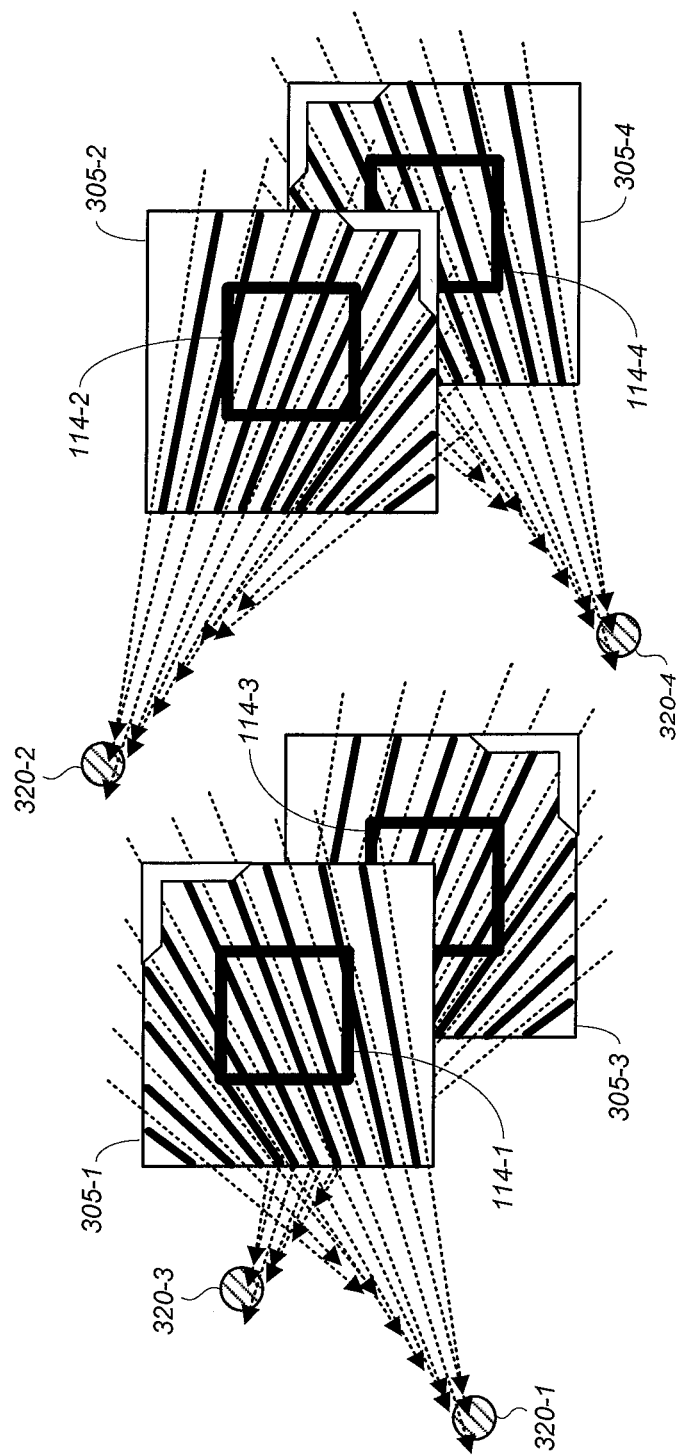

FIG. 13 schematically shows the bottom sides of flow control covers 305-1 and 305-1 of adjacent processor cooling stacks 300 on a first motherboard 112, and the bottom sides of flow control covers 305-3 and 305-4 of adjacent processor cooling stacks 300 on a second motherboard 112. The flow control covers 305-1 and 302 are depicted offset from the flow control covers 305-3 and 305-4 for illustration purposes. In practice, the flow control covers 305-1 and 305-2 will generally overlap the flow control covers 305-3 and 305-4 except for some offset due to the interlacing of the memory cards 113. As shown in FIG. 13, vapor bubbles tend to flow away from the processors 114 because of the location of the focus regions 320.

Figure 14:
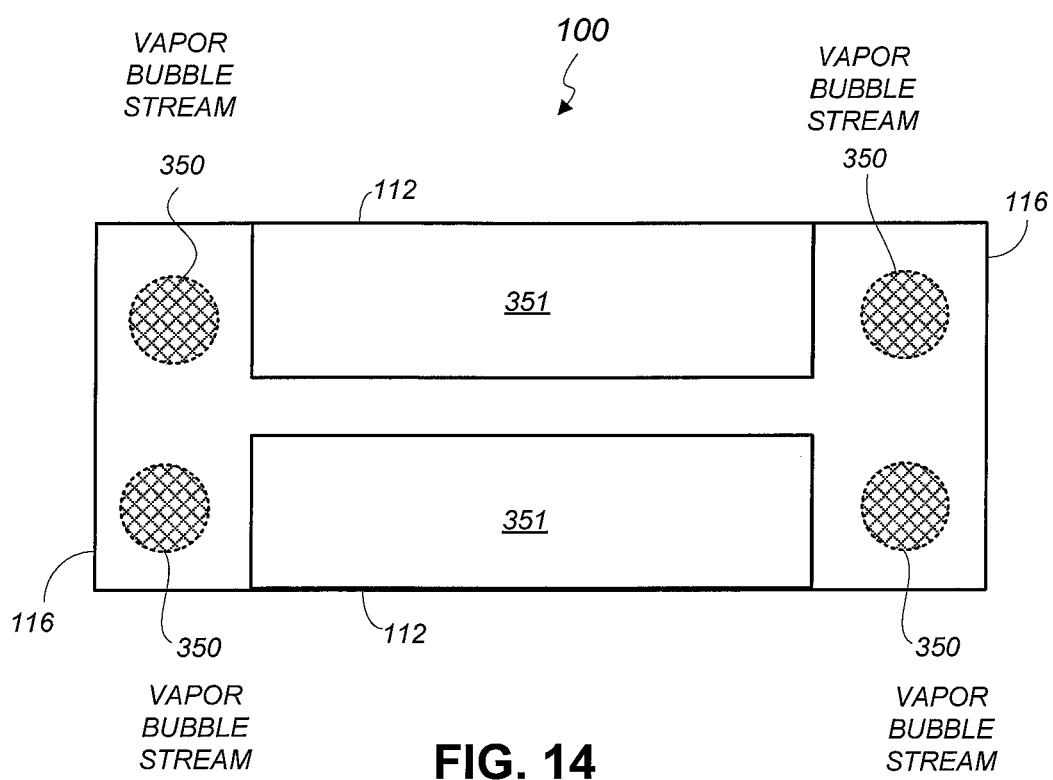
FIG. 14 schematically shows a bottom-end view of a node assembly in accordance with an embodiment of the present invention.

FIG. 14 schematically shows a bottom-end view of a node assembly 100 in accordance with an embodiment of the present invention. As shown in FIG. 14, the dual-stacked motherboards 112 are on opposing sides of the node assembly 100, whereas the frames 116 are on opposing sides that are perpendicular to the motherboards 112. In FIG. 14, each of the blocks 351 represents processors 114 and their corresponding processor cooling stacks 300. The processor cooling stacks 300 with their corresponding flow regulation structures 304 allow for the stream of vapor bubbles (FIG. 14, 350) to generally flow along the sides of the blocks 351. It is to be noted that in embodiments where interlaced memory cards 113 flank the processors 114, the stream of vapor bubbles will flow along the planes of the memory cards 113. This streamlines the vapor bubbles and allows sufficient coolant fluid to come in and replenish regions around the processor.

Figure 15:
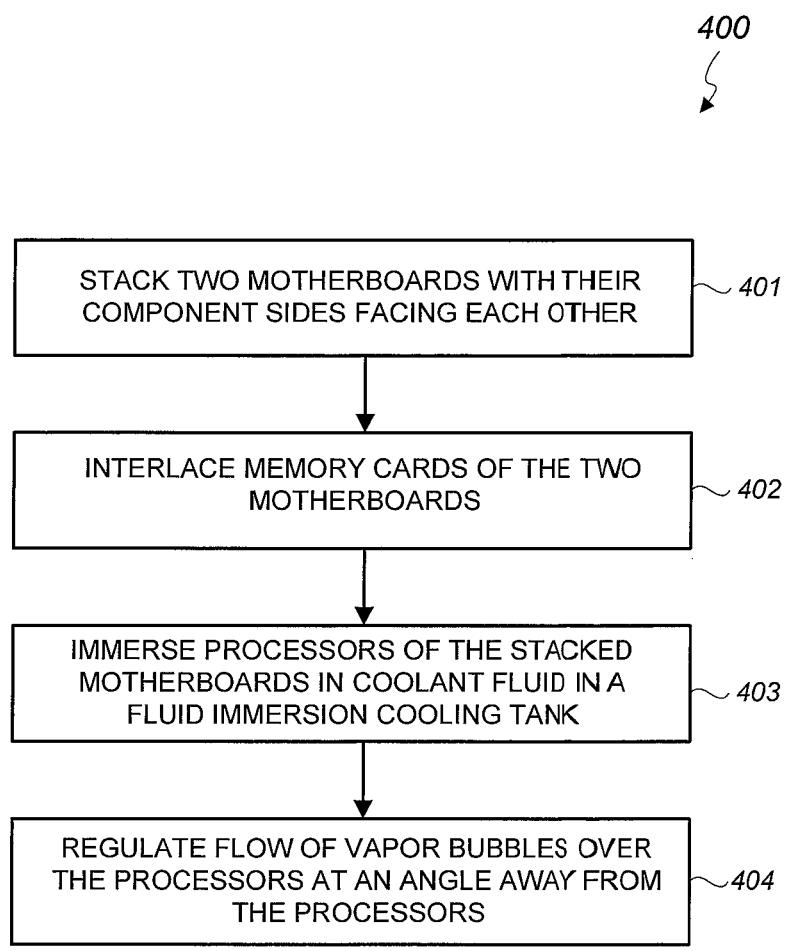
FIG. 15 shows a flow diagram of a method of cooling dual-stacked motherboards of a server computer system in accordance with an embodiment of the present invention.

FIG. 15 shows a flow diagram of a method 400 of cooling dual-stacked motherboards of a server computer system in accordance with an embodiment of the present invention. In step 401, two motherboards are dual-stacked, i.e., one over another, with the component sides of the motherboards facing toward each other. The component side of a motherboard is the side of the motherboard where the processor and memory are mounted. In step 402, the memory cards of the dual-stacked motherboards are interlaced in alternating fashion. In step 403, at least the processors of the dual-stacked motherboards are immersed in a coolant fluid in a fluid immersion cooling tank. In step 404, vapor bubbles of the coolant fluid over the processors are regulated to flow at an angle away from the processors. The regulation of the vapor bubbles may be performed using flow regulation structures over a processor. The flow regulation structures may have sidewalls that are perpendicular to a flow control cover that is disposed over the processor.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A computer system comprising:
a first node assembly comprising a first motherboard and a second motherboard, the first motherboard having a first processor and a first plurality of memory cards mounted thereon, the second motherboard having a second processor and a second plurality of memory cards mounted thereon, each of the first plurality of memory cards and the second plurality of memory cards having an integrated circuit (IC) memory chip,
wherein a first plate having a boiling enhancement coating (BEC) is attached to a surface of the first processor, a second plate having a BEC coating is attached to a surface of the second processor, the first plate attached to the surface of the first processor and the second plate attached to the surface of the second processor face toward and overlap each other, and
each memory card of the first plurality of memory cards is interlaced between corresponding adjacent memory cards of the second plurality of memory cards; and
a fluid immersion cooling tank, wherein the first processor, the second processor, the first plurality of memory cards, and the second plurality of memory cards are immersed in a dual-phase coolant fluid in the fluid immersion cooling tank, the dual-phase coolant fluid configured to pass between the first plate and the second plate.

2. The computer system of claim 1, further comprising: a second node assembly comprising a third motherboard and a fourth motherboard, each of the third and fourth motherboards having an additional processor and additional memory cards mounted thereon, each of the additional memory cards mounted on the third and fourth motherboards having an IC memory chip, wherein the additional memory cards mounted on the third motherboard are interlaced with the additional memory cards mounted on the fourth motherboard, and wherein at least the additional processors mounted on the third and fourth motherboards are immersed in the dual-phase coolant fluid in the fluid immersion cooling tank.

3. The computer system of claim 1, wherein the first and second motherboards of the first node assembly have identical component layouts.

4. The computer system of claim 1, wherein the first node assembly further comprises a first frame and a second frame that support the first and second motherboards to form a cuboid with an open top end and an open bottom end.

5. The computer system of claim 4, wherein each of the first and second frames has a plurality of openings.

6. The computer system of claim 4, wherein the first node assembly further comprises a handle that is attached to the first and second frames on the open top end.

7. A node assembly of a server computer system, the node assembly comprising:
a first motherboard having a component side where a first processor, a first set of memory cards, and a second set of memory cards are mounted, wherein the first processor is disposed between the first and second sets of memory cards, and a first plate with boiling enhancement coating (BEC) is attached to a surface of the first processor; and
a second motherboard having a component side where a second processor, a third set of memory cards, and a fourth set of memory cards are mounted, wherein the second processor is disposed between the third and fourth sets of memory cards, and a second plate with BEC coating is attached to a surface of the second processor,
wherein the first motherboard is stacked over the second motherboard with the component side of the first motherboard facing toward the component side of the second motherboard, each memory card of the first of set of memory cards is interlaced between corresponding adjacent memory cards of the third set of memory cards, each memory card of the second set of memory cards is interlaced between corresponding adjacent memory cards of the fourth set of memory cards, the first plate attached to the surface of the first processor and the second plate attached to the surface of the second processor face toward and overlap each other, and at least the first processor, the second processor, the first set of memory cards, the second set of memory cards, the third set of memory cards, and the fourth set of memory cards are immersed in a dual-phase coolant fluid in a fluid immersion cooling tank, the dual-phase coolant fluid configured to pass between the first plate and the second plate.

8. The node assembly of claim 7, wherein the node assembly has a shape of a cuboid, with the first and second motherboards forming opposing sides of the cuboid.

9. The node assembly of claim 8, wherein the node assembly further comprises a first frame and a second frame that each supports a respective one of the first and second motherboards, wherein each of the first and second frames form opposing sides of the cuboid.

10. The node assembly of claim 9, wherein the cuboid has opposing top and bottom ends that are open.

11. The node assembly of claim 10, wherein the node assembly further comprises a handle that is attached to the first and second frames on the top end of the cuboid.

* * * * *